(12) United States Patent
Lee

(10) Patent No.: US 12,525,560 B2
(45) Date of Patent: Jan. 13, 2026

(54) SEMICONDUCTOR DEVICE INCLUDING BONDING PAD

(71) Applicant: SK hynix Inc., Gyeonggi-do (KR)

(72) Inventor: Byung Ho Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 375 days.

(21) Appl. No.: 18/307,816

(22) Filed: Apr. 27, 2023

(65) Prior Publication Data

US 2024/0178169 A1     May 30, 2024

(30) Foreign Application Priority Data

Nov. 25, 2022   (KR) ........................ 10-2022-0160373

(51) Int. Cl.
    *H01L 23/48*       (2006.01)
    *H01L 23/00*       (2006.01)
    (Continued)

(52) U.S. Cl.
    CPC .............. *H01L 24/08* (2013.01); *H01L 24/05* (2013.01); *H01L 24/06* (2013.01); *H10D 1/68* (2025.01);
    (Continued)

(58) Field of Classification Search
    CPC ......... H01L 24/08; H01L 24/05; H01L 24/06; H01L 2224/05554; H01L 2224/05611; H01L 2224/05639; H01L 2224/05644; H01L 2224/05647; H01L 2224/0603; H01L 2224/06151; H01L 2224/08145; H01L 2224/48247; H01L 2224/04042; H01L 2224/48137; H01L 2224/0401; H01L 25/0657; H01L 2224/48465; H01L 2224/32145; H01L 2224/85205; H01L 2224/48463; H01L 2224/16145; H01L 24/02; H01L 2224/48145; H01L 2224/04105; H01L 25/0652; H01L 2924/15153; H01L 2224/4847;
(Continued)

(56) References Cited

U.S. PATENT DOCUMENTS 6,906,905 B1    6/2005    Chinthakindi
10,600,760 B2    3/2020    Haba et al.
(Continued)

*Primary Examiner* — Niki H Nguyen
(74) *Attorney, Agent, or Firm* — IP & T GROUP LLP

(57) ABSTRACT

A semiconductor device includes: a lower semiconductor structure including a plurality of first lower electrode bonding pads, a plurality of second lower electrode bonding pads, and a lower connection pattern connecting the plurality of first lower electrode bonding pads to each other while being connected to a first voltage; and an upper semiconductor structure disposed over the lower semiconductor structure and including a plurality of first upper electrode bonding pads, a plurality of second upper electrode bonding pads, and an upper connection pattern connecting the plurality of second upper electrode bonding pads to each other while being connected to a second voltage different from the first voltage, wherein the plurality of first lower electrode bonding pads are bonded to the plurality of first upper electrode bonding pads, respectively, and the plurality of second lower electrode bonding pads are bonded to the plurality of second upper electrode bonding pads, respectively.

22 Claims, 7 Drawing Sheets

(51) Int. Cl.
  *H01L 23/52*  (2006.01)
  *H01L 29/40*  (2006.01)
  *H10D 1/68*  (2025.01)

(52) U.S. Cl.
  CPC ............... *H01L 2224/05554* (2013.01); *H01L 2224/05555* (2013.01); *H01L 2224/05611* (2013.01); *H01L 2224/05639* (2013.01); *H01L 2224/05644* (2013.01); *H01L 2224/05647* (2013.01); *H01L 2224/05655* (2013.01); *H01L 2224/0603* (2013.01); *H01L 2224/06151* (2013.01); *H01L 2224/08145* (2013.01)

(58) Field of Classification Search
  CPC ........... H01L 21/4853; H01L 23/49513; H01L 2224/05548; H01L 2224/81801; H01L 2224/04026; H01L 2224/12105; H01L 2224/24137; H01L 2224/06051; H01L 2224/05008; H01L 2224/4824; H01L 2224/1403; H01L 2225/06555; H01L 2224/8034; H01L 2224/16146; H10D 1/68

See application file for complete search history.

(56) References Cited

U.S. PATENT DOCUMENTS

| | | | | |
|---|---|---|---|---|
| 11,842,894 | B2* | 12/2023 | Katkar | H01L 24/06 |
| 12,308,332 | B2* | 5/2025 | DeLaCruz | G01R 31/2856 |
| 2011/0050320 | A1* | 3/2011 | Gillingham | H01L 23/481 |
| | | | | 327/365 |
| 2016/0111386 | A1* | 4/2016 | England | H01L 24/03 |
| | | | | 438/107 |
| 2018/0175012 | A1* | 6/2018 | Wu | H01L 24/29 |
| 2018/0219038 | A1* | 8/2018 | Gambino | H10F 39/811 |
| 2018/0323227 | A1* | 11/2018 | Zhang | H01L 24/80 |
| 2018/0366446 | A1* | 12/2018 | Haba | H01L 21/2007 |
| 2019/0131277 | A1* | 5/2019 | Yang | H01L 24/80 |
| 2019/0252375 | A1* | 8/2019 | Delacruz | H10D 88/01 |
| 2020/0075553 | A1* | 3/2020 | Delacruz | H01L 25/0657 |
| 2021/0066255 | A1* | 3/2021 | Chen | H01L 21/565 |

\* cited by examiner

SEMICONDUCTOR DEVICE INCLUDING BONDING PAD

CROSS-REFERENCE TO RELATED APPLICATION

This application claims priority under 35 U.S.C. § 119 to Korean Patent Application No. 10-2022-0160373 filed on Nov. 25, 2022, which is incorporated herein by reference in its entirety.

BACKGROUND

1. Technical Field

This patent document relates generally to a semiconductor technology and, more particularly, to a semiconductor device including a bonding pad.

2. Related Art

Electronic products require increasingly higher-capacity, higher data processing even though their volume is getting smaller. Accordingly, a semiconductor structure such as a semiconductor chip and a semiconductor wafer used in these electronic products is also required to have a thin thickness and a small size. Furthermore, a form of embedding a plurality of semiconductor structures in one semiconductor device is being implemented.

A plurality of semiconductor structures may be electrically connected to each other using bonding pads while being stacked in a vertical direction.

SUMMARY

The disclosed technology in this patent document includes various embodiments of a semiconductor device capable of simplifying a manufacturing process and reducing an area by forming a capacitor using a bonding pad.

In an embodiment, a semiconductor device includes: a lower semiconductor structure including a plurality of first lower electrode bonding pads, a plurality of second lower electrode bonding pads, and a lower connection pattern connecting the plurality of first lower electrode bonding pads to each other, wherein the lower connection pattern is connected to a first voltage; and an upper semiconductor structure disposed over the lower semiconductor structure and including a plurality of first upper electrode bonding pads, a plurality of second upper electrode bonding pads, and an upper connection pattern connecting the plurality of second upper electrode bonding pads to each other, wherein the upper connection pattern is connected to a second voltage that is different from the first voltage, wherein the plurality of first lower electrode bonding pads are bonded to the plurality of first upper electrode bonding pads, respectively, to form a plurality of first bonding structures, and the plurality of second lower electrode bonding pads are bonded to the plurality of second upper electrode bonding pads, respectively, to form a plurality of second bonding structures.

In another embodiment, a semiconductor device includes: lower and upper semiconductor structures stacked on each other, the lower semiconductor structure including a plurality of first and second lower electrode bonding pads arranged at a regular interval along a first direction in an alternating manner, the upper semiconductor structure including a plurality of first and second upper electrode bonding pads arranged at a regular interval along a first direction in an alternating manner, wherein the plurality of first and second upper electrode bonding pads are in direct contact with the plurality of first and second lower electrode bonding pads, respectively, wherein a lower connection pattern connecting the plurality of first lower electrode bonding pads to each other and to a first voltage; and wherein an upper connection pattern connecting the plurality of second upper electrode bonding pads to each other and to a second voltage that is different from the first voltage.

DETAILED DESCRIPTION

Figure 1:
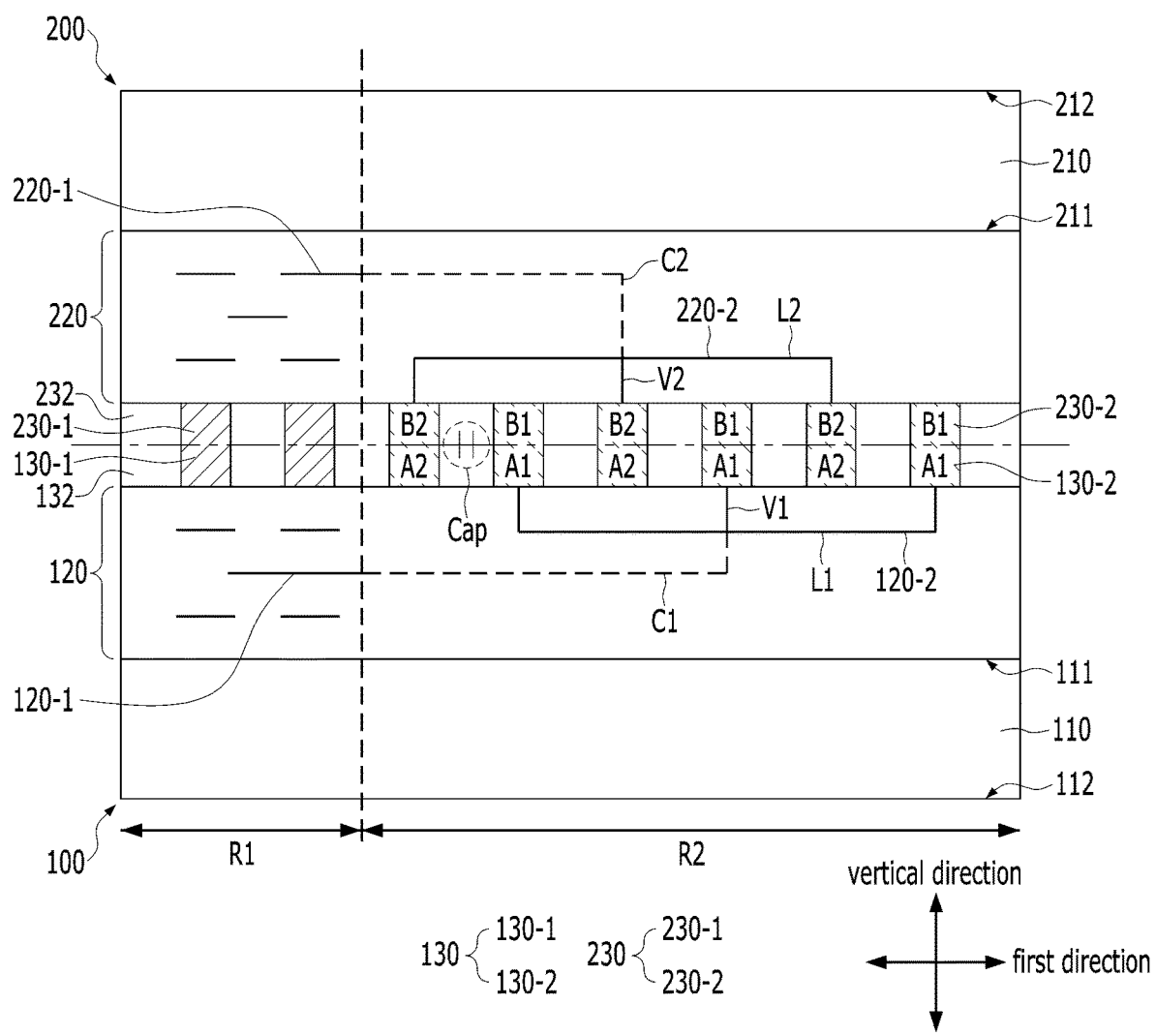
FIG. 1 is a cross-sectional view illustrating a semiconductor device according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the following description, a semiconductor structure may mean a semiconductor wafer, a semiconductor chip, or the like including an integrated circuit that performs a predetermined function. Also, a semiconductor device may include two or more semiconductor structures stacked in a vertical direction and electrically connected to each other. Two or more semiconductor structures may be connected to each other using a bonding pad. Here, the bonding pad may include a real bonding pad that is electrically connected to the integrated circuit and performs a bonding function, and a dummy bonding pad that is not electrically connected to other components and simply performs a bonding function. Hereinafter, it will be described in more detail with reference to the drawings.

FIG. 1 is a cross-sectional view illustrating a semiconductor device according to an embodiment of the present disclosure.

Referring to FIG. 1, a semiconductor device according to an embodiment of the present disclosure may include a lower semiconductor structure 100 and an upper semiconductor structure 200 disposed over the lower semiconductor structure 100 and electrically connected to the lower semiconductor structure 100.

The lower semiconductor structure 100 may include a lower semiconductor substrate 110, a lower circuit unit 120, a lower bonding pad 130 including a plurality of lower real bonding pads 130-1 and a plurality of lower electrode bonding pads 130-2, and a lower bonding insulating layer 132. In an embodiment, the plurality of lower real bonding pads 130-1 and the plurality of the lower electrode bonding pads 130-2 are disposed within the lower bonding insulating layer 132 at regular intervals along the first direction.

The lower semiconductor substrate 110 may include a semiconductor material such as silicon and germanium, and may have a front surface 111, a rear surface 112, and a side surface connecting them to each other. The front surface 111 may correspond to an active surface on which the lower circuit unit 120 is disposed, and the rear surface 112 may correspond to an inactive surface located at the opposite side of the front surface 111. In the present embodiment, the lower semiconductor substrate 110 may be disposed such that the front surface 111 faces upward and the rear surface 112 faces downward.

The lower semiconductor substrate 110 may include a first region R1 in which an integrated circuit and the lower real bonding pad 130-1 are disposed, and a second region R2 in which the lower electrode bonding pad 130-2 is disposed. The first region R1 may be a chip region, and the second region R2 may be a dummy region. The lower circuit unit 120 may be disposed over the front surface 111 of the lower semiconductor substrate 110, and the lower bonding pad 130 and the lower bonding insulating layer 132 may be disposed over the lower circuit unit 120.

The lower circuit unit 120 disposed over the first region R1 of the lower semiconductor substrate 110 may include an integrated circuit implemented to perform a certain function such as data storage and data processing by combining and electrically connecting various discrete elements, and an insulating layer in which the integrated circuit is buried. The discrete elements may include an active element such as a transistor, a passive element such as a resistor and a capacitor, or the like. For convenience of description, the components constituting the integrated circuit are briefly shown as some lines in the lower circuit unit 120, but are not limited to those shown, and the integrated circuit may be implemented in various ways depending on the type of the lower semiconductor structure 100. For example, when the lower semiconductor structure 100 includes a volatile memory such as DRAM (Dynamic Random Access Memory) and SRAM (Static RAM), or a nonvolatile memory such as NAND flash, RRAM (Resistive RAM), PRAM (Phase-change RAM), MRAM (Magneto-resistive RAM), and FRAM (Ferroelectric RAM), the integrated circuit may include a memory cell array including a plurality of memory cells. Alternatively, for example, when the lower semiconductor structure 100 is a logic chip or a controller including a peripheral circuit for driving a memory, the integrated circuit may include the peripheral circuit. A conductive pattern of the integrated circuit, which is connected to a first voltage, is indicated by a reference numeral 120-1, and will be hereinafter referred to as a first voltage application pattern 120-1. The first voltage may correspond to one of a power voltage and a ground voltage.

The lower real bonding pads 130-1 may be located over the lower circuit unit 120 in the first region R1 of the lower semiconductor substrate 110, and may be electrically connected to the integrated circuit. Although two lower real bonding pads 130-1 are shown in this cross-sectional view, the present disclosure is not limited thereto. The number and arrangement of the lower real bonding pads 130-1 may be variously modified.

The lower electrode bonding pads 130-2 may be located over the lower circuit unit 120 in the second region R2 of the lower semiconductor substrate 110. Here, the lower electrode bonding pads 130-2 may be formed using a dummy bonding pad. In general, a dummy bonding pad may refer to a pad that is not electrically connected to other components and simply performs a bonding function. However, in the present embodiment, the dummy bonding pad may be electrically connected to other components, and thus, the dummy bonding pad may perform a function as an electrode of a capacitor, in addition to a bonding function. In this way, a pad that performs a bonding function and a function as an electrode of a capacitor will be referred to as an 'electrode bonding pad'. However, in order to function as an electrode of a capacitor, different voltages may be applied to a plurality of lower electrode bonding pads 130-2. The lower electrode bonding pads 130-2 to which the aforementioned first voltage is applied is denoted by A1, and will be referred to as first lower electrode bonding pads. In addition, the lower electrode bonding pads 130-2 to which a second voltage different from the first voltage is applied is denoted by A2, and will be referred to as second lower electrode bonding pads. When the first voltage is a power voltage, the second voltage may be a ground voltage. Alternatively, when the first voltage is a ground voltage, the second voltage may be a power voltage.

The lower electrode bonding pads 130-2 may include one or more first lower electrode bonding pads A1 and one or more second lower electrode bonding pads A2. In this cross-sectional view, a case in which three first lower electrode bonding pads A1 and three second lower electrode bonding pads A2 are alternately arranged along the first direction is illustrated, but the present disclosure is not limited thereto. The number and arrangement of the first and second lower electrode bonding pads A1 and A2 may be variously modified. Various examples of the number and arrangement of the first and second lower electrode bonding pads A1 and A2 will be described in detail with reference to FIGS. 2 to 5 to be described later.

The lower circuit unit 120 disposed over the second region R2 of the lower semiconductor substrate 110 may include a lower connection pattern 120-2 connected to the first lower electrode bonding pads A1. The lower connection pattern 120-2 may be electrically blocked from the second lower electrode bonding pad A2. When a plurality of first lower electrode bonding pads A1 are disposed, the lower connection pattern 120-2 may connect them to each other. The lower connection pattern 120-2 may be formed by a combination of lower conductive vias V1 and a lower conductive line L1. The lower conductive vias V1 may have a pillar shape extending in a vertical direction, and the lower conductive line L1 may have a line shape extending in the first direction. In this cross-sectional view, three lower conductive vias V1 are formed under three first lower electrode bonding pads A1, respectively. One lower conductive line L1 is disposed under and commonly connected to the three first lower conductive vias V1 while extending in the first direction. However, the present disclosure is not limited thereto, and the number and arrangement of the lower conductive vias V1 and the lower conductive lines L1, that is, the shape of the lower connection pattern 120-2 may be variously modified. Various examples of the number and arrangement of the lower conductive vias V1 and the lower conductive lines L1, that is, the shape of the lower connection pattern 120-2, will be described in detail with reference to FIGS. 2 to 5 to be described later.

The first voltage may be applied to the lower connection pattern 120-2. To this end, the lower connection pattern 120-2 may be electrically connected to the first voltage application pattern 120-1 of the first region R1 through a conductive pattern C1 indicated by a dotted line. The conductive pattern C1 may be connected to a portion of the lower connection pattern 120-2, and may extend to the first region R1 to be connected to the first voltage application pattern 120-1. To this end, the conductive pattern C1 may have various shapes. For example, as shown in this cross-sectional view, the conductive pattern C1 may be formed by a combination of a first conductive pattern disposed under the lower connection pattern 120-2 and extending vertically downward, and a second conductive pattern extending toward the first region R1 from the first conductive pattern.

Meanwhile, the lower bonding pads 130 may be electrically and/or physically connecting the lower semiconductor structure 100 to the upper semiconductor structure 200. The lower bonding pads 130 may include various conductive materials. In particular, when the lower bonding pads 130 are directly bonded to the upper bonding pads 230 of the upper semiconductor structure 200 to form a hybrid bonding structure, the lower bonding pads 130 may include a metal material that can be bonded to the upper bonding pads 230 by interdiffusion of metals through a high-temperature annealing process. For example, the lower bonding pads 130 may include a metal such as copper (Cu), nickel (Ni), tin (Sn), gold (Au), and silver (Ag), a combination thereof, or a compound thereof.

The lower bonding insulating layer 132 may be formed to fill a space between the lower bonding pads 130 over the lower circuit unit 120. The lower bonding insulating layer 132 may include various insulating materials. In particular, when the lower bonding insulating layer 132 is directly bonded to the upper bonding insulating layer 232 of the upper semiconductor structure 200 to form a hybrid bonding structure, the lower bonding insulating layer 132 may include an insulating material that can be combined with the upper bonding insulating layer 232 by a covalent bond between insulating materials. For example, the lower bonding insulating layer 132 may include silicon oxide, silicon nitride, or a combination thereof.

The upper semiconductor structure 200 may include an upper semiconductor substrate 210, an upper circuit unit 220, the upper bonding pads 230 including upper real bonding pads 230-1 and upper electrode bonding pads 230-2, and an upper bonding insulating layer 232.

The upper semiconductor substrate 210 may include a semiconductor material such as silicon and germanium, and may have a front surface 211, a rear surface 212, and a side surface connecting them to each other. The front surface 211 may correspond to an active surface on which the upper circuit unit 220 is disposed, and the rear surface 212 may correspond to an inactive surface located at the opposite side of the front surface 211. In the present embodiment, the upper semiconductor substrate 210 may be disposed such that the front surface 211 faces downward and the rear surface 212 faces upward.

The upper semiconductor substrate 210 may include a first region R1 in which an integrated circuit and the upper real bonding pad 230-1 are disposed, and a second region R2 in which the upper electrode bonding pad 230-2 is disposed. The upper circuit unit 220 may be disposed under the front surface 211 of the upper semiconductor substrate 210, and the upper bonding pad 230 and the upper bonding insulating layer 232 may be disposed under the upper circuit unit 220.

The upper circuit unit 220 disposed under the first region R1 of the upper semiconductor substrate 210 may include an integrated circuit implemented to perform a certain function by combining and electrically connecting various discrete elements, and an insulating layer in which the integrated circuit is buried. For convenience of description, the components constituting the integrated circuit are briefly shown as some lines in the upper circuit unit 220, but are not limited to those shown, and the integrated circuit may be implemented in various ways depending on the type of the upper semiconductor structure 200. For example, when the upper semiconductor structure 200 includes a volatile memory such as DRAM (Dynamic Random Access Memory) and SRAM (Static RAM), or a nonvolatile memory such as NAND flash, RRAM (Resistive RAM), PRAM (Phase-change RAM), MRAM (Magneto-resistive RAM), and FRAM (Ferroelectric RAM), the integrated circuit may include a memory cell array including a plurality of memory cells. Alternatively, for example, when the upper semiconductor structure 200 is a logic chip or a controller including a peripheral circuit for driving a memory, the integrated circuit may include the peripheral circuit. The upper semiconductor structure 200 may include the same type of memory as the lower semiconductor structure 100, or may include a different type of memory. Alternatively, one of the lower semiconductor structure 100 and the upper semiconductor structure 200 may include a memory, and the other of the lower semiconductor structure 100 and the upper semiconductor structure 200 may include a peripheral circuit for driving the memory. A conductive pattern of the integrated circuit, which is connected to a second voltage, is indicated by a reference numeral 220-1, and will be hereinafter referred to as a second voltage application pattern 220-1. As described above, the second voltage may be a voltage different from the first voltage, and may correspond to one of a power voltage and a ground voltage.

The upper real bonding pad 230-1 may be located under the upper circuit unit 220 in the first region R1 of the upper semiconductor substrate 210, and may be electrically connected to the integrated circuit. Further, a plurality of upper real bonding pads 230-1 may be arranged to respectively overlap the plurality of lower real bonding pads 130-1.

The upper electrode bonding pad 230-2 may be located under the upper circuit unit 220 in the second region R2 of the upper semiconductor substrate 210. Different voltages may be applied to a plurality of upper electrode bonding pads 230-2. The upper electrode bonding pad 230-2 to which the first voltage is applied is denoted by B1, and will be referred to as a first upper electrode bonding pad. In addition, the upper electrode bonding pad 230-2 to which the second voltage is applied is denoted by B2, and will be referred to as a second upper electrode bonding pad.

The plurality of upper electrode bonding pads 230-2 may be arranged to respectively overlap the plurality of lower electrode bonding pads 130-2. Further, a plurality of first upper electrode bonding pads B1 may be arranged to respectively overlap the plurality of first lower electrode bonding pads A1, and a plurality of second upper electrode bonding pads B2 may be arranged to respectively overlap the plurality of second lower electrode bonding pads A2.

The upper circuit unit 220 disposed under the second region R2 of the upper semiconductor substrate 210 may include an upper connection pattern 220-2 connected to the second upper electrode bonding pad B2. The upper connection pattern 220-2 may be electrically blocked from the first upper electrode bonding pad B1. When the plurality of second upper electrode bonding pads B2 are disposed, the upper connection pattern 220-2 may connect them to each other. The upper connection pattern 220-2 may be formed by a combination of upper conductive vias V2 and an upper conductive line L2. In this cross-sectional view, three upper conductive vias V2 are formed over three second upper electrode bonding pads B2, respectively, and one upper conductive line L2 is disposed over and commonly connected to the three second upper conductive vias V2 while extending in the first direction. However, the present disclosure is not limited thereto, and the number and arrangement of the upper conductive vias V2 and the upper conductive lines L2, that is, the shape of the upper connection pattern 220-2 may be variously modified. Various examples of the number and arrangement of the upper conductive vias V2 and the upper conductive lines L2, that is, the shape of the upper connection pattern 220-2, will be described in detail with reference to FIGS. 2 to 5 to be described later.

The second voltage may be applied to the upper connection pattern 220-2. To this end, the upper connection pattern 220-2 may be electrically connected to the second voltage application pattern 220-1 of the first region R1 through a conductive pattern C2 indicated by a dotted line. The conductive pattern C2 may be connected to a portion of the upper connection pattern 220-2, and may extend to the first region R1 to be connected to the second voltage application pattern 220-1. To this end, the conductive pattern C2 may have various shapes. For example, as shown in this cross-sectional view, the conductive pattern C2 may be formed by a combination of a first conductive pattern disposed over the upper connection pattern 220-2 and extending vertically upward, and a second conductive pattern extending toward the first region R1 from the first conductive pattern.

The upper bonding pad 230 may be for electrically and/or physically connecting the upper semiconductor structure 200 to the lower semiconductor structure 100. The upper bonding pad 230 may include various conductive materials. In particular, when the upper bonding pad 230 is directly bonded to the lower bonding pad 130 to form a hybrid bonding structure, the upper bonding pad 230 may include a metal material that can be bonded to the lower bonding pad 130 by interdiffusion of metals through a high-temperature annealing process. For example, the upper bonding pad 230 may include a metal such as copper (Cu), nickel (Ni), tin (Sn), gold (Au), and silver (Ag), a combination thereof, or a compound thereof. The upper bonding pad 230 may include the same material as the lower bonding pad 130.

The upper bonding insulating layer 232 may be formed to fill a space between the upper bonding pads 230 under the upper circuit unit 220. The upper bonding insulating layer 232 may include various insulating materials. In particular, when the upper bonding insulating layer 232 is directly bonded to the lower bonding insulating layer 132 to form a hybrid bonding structure, the upper bonding insulating layer 232 may include an insulating material that can be combined with the lower bonding insulating layer 132 by a covalent bond between insulating materials. For example, the upper bonding insulating layer 232 may include silicon oxide, silicon nitride, or a combination thereof. The upper bonding insulating layer 232 may include the same material as the lower bonding insulating layer 132.

The lower semiconductor structure 100 and the upper semiconductor structure 200 may be bonded in a state in which the lower bonding pad 130 and the upper bonding pad 230 face each other, and the lower bonding insulating layer 132 and the upper bonding insulating layer 232 face each other, and thus, a semiconductor device as shown may be implemented. More specifically, in a state in which the lower bonding pad 130 and the lower bonding insulating layer 132 of the lower semiconductor structure 100 contact the upper bonding pad 230 and the upper bonding insulating layer 232 of the upper semiconductor structure 200, respectively, a high-temperature annealing process may be performed to form a metal-to-metal bonding between the lower bonding pad 130 and the upper bonding pad 230, and an insulator-to-insulator bonding between the lower bonding insulating layer 132 and the upper bonding insulating layer 232. Thus, hybrid bonding between the lower semiconductor structure 100 and the upper semiconductor structure 200 may be achieved.

A structure formed by bonding the first lower electrode bonding pad A1 and the first upper electrode bonding pad B1 will be referred to as a first bonding structure A1 and B1, and a structure formed by bonding the second lower electrode bonding pad A2 and the second upper electrode bonding pad B2 will be referred to as a second bonding structure A2 and B2. A plurality of first bonding structures A1 and B1 and a plurality of second bonding structures A2 and B2 may be alternately arranged along the first direction, and a stacked structure of the lower bonding insulating layer 132 and the upper bonding insulating layer 232 may be interposed between the first bonding structures A1 and B1 and the second bonding structures A2 and B2 which are adjacent to each other. Here, the first voltage may be applied to the first bonding structures A1 and B1 through the lower connection pattern 120-2, and the second voltage may be applied to the second bonding structures A2 and B2 through the upper connection pattern 220-2. Accordingly, the first bonding structures A1 and B1, the second bonding structures A2 and B2, and the stacked structure of the lower bonding insulating layer 132 and the upper bonding insulating layer 232 therebetween may form a capacitor (Cap). This capacitor may correspond to a metal-insulator-metal (MIM) capacitor.

According to the semiconductor device described above, by forming a capacitor using a bonding pad, the manufacturing process of the semiconductor device may be simplified. In particular, since an electrode bonding pad is formed together with a real bonding pad, and a connection pattern for electrical connection with the electrode bonding pad is formed together with an integrated circuit, the manufacturing process of the semiconductor device may be simplified. Furthermore, since a dummy bonding pad generally formed to improve a bonding function is used as a capacitor electrode, there may be no need to secure an additional area for forming a capacitor. Accordingly, it may be possible to reduce the area of the semiconductor device.

Figure 2:
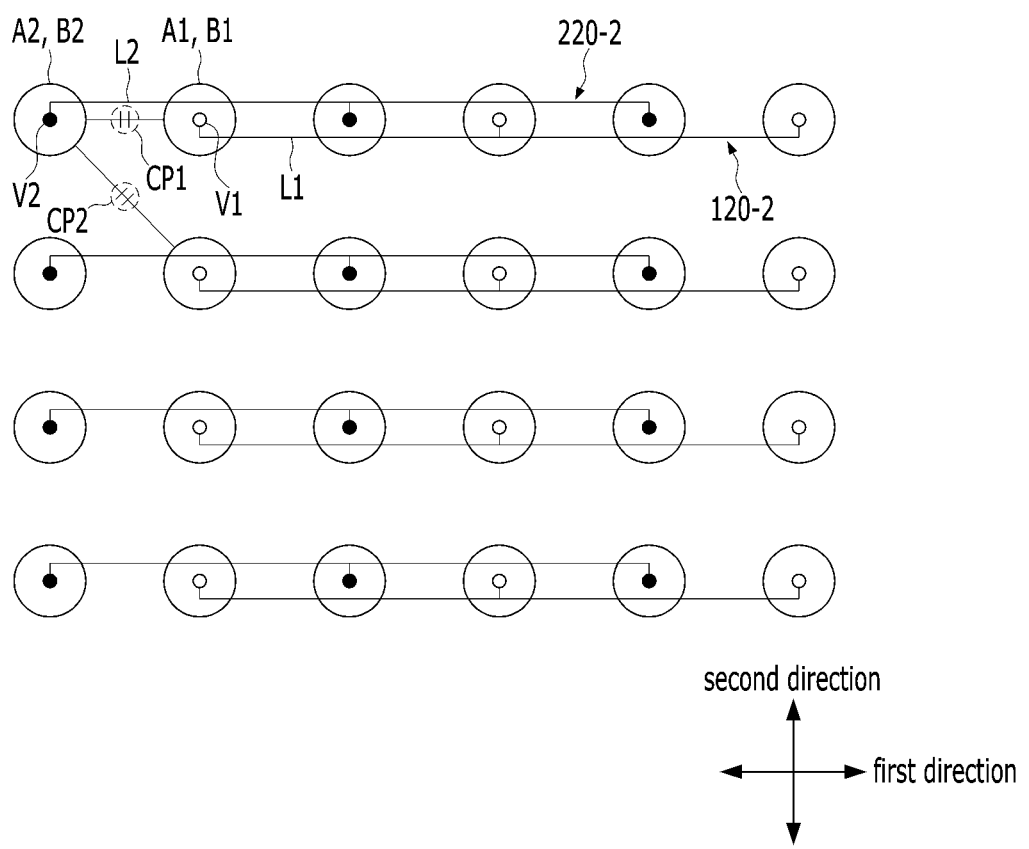
FIG. 2 is a plan view of a semiconductor device according to another embodiment of the present disclosure.

FIG. 2 is a plan view of a semiconductor device according to another embodiment of the present disclosure, in particular, a top view of a region corresponding to the second region of FIG. 1.

Referring to FIG. 2, a plurality of first bonding structures A1 and B1 each including a first lower electrode bonding pad A1 and a first upper electrode bonding pad B1 bonded to each other may be provided. The plurality of first bonding structures A1 and B1 may be arranged in a matrix form along first and second directions. In addition, a plurality of second bonding structure A2 and B2 each including a second lower electrode bonding pad A2 and a second upper electrode bonding pad B2 bonded to each other may be provided. The plurality of second bonding structures A2 and B2 may be arranged in a matrix form along the first and second directions.

In the first direction, the first bonding structures A1 and B1 and the second bonding structures A2 and B2 may be alternately arranged. On the other hand, in the second direction, the first bonding structures A1 and B1 may be arranged in first lines, and the second bonding structures A2 and B2 may be arranged in second lines, wherein the first and second lines are alternating along the first direction. As an example, in the first direction or in the second direction, the first bonding structures A1 and B1 and the second bonding structures A2 and B2 may be alternately arranged at a regular interval.

The first bonding structures A1 and B1 may be electrically connected to each other through a lower connection pattern 120-2. The lower connection pattern 120-2 may include a plurality of lower conductive vias V1 disposed under and connected to the first bonding structures A1 and B1, respectively, and a lower conductive line L1 disposed under the lower conductive vias V1 and extending in a direction to connect the lower conductive vias V1 to each other.

The second bonding structures A2 and B2 may be electrically connected to each other through an upper connection pattern 220-2. The upper connection pattern 220-2 may include a plurality of upper conductive vias V2 disposed over and connected to the second bonding structures A2 and B2, respectively, and an upper conductive line L2 disposed over the upper conductive vias V2 and extending in a direction to connect the upper conductive vias V2 to each other.

In this figure, for convenience of description, it is illustrated that the lower conductive line L1 and the upper conductive line L2 are spaced apart from each other in the second direction in order to be distinguished. However, the present disclosure is not limited thereto, and the lower conductive line L1 may overlap the lower conductive vias V1 while extending in the first direction, and the upper conductive line L2 may overlap the upper conductive vias V2 while extending in the first direction. Thus, the lower conductive line L1 and the upper conductive line L2 may overlap with each other in the second direction.

Since different voltages are applied to the first bonding structures A1 and B1 and the second bonding structures A2 and B2, each pair of the first bonding structures A1 and B1 and the second bonding structures A2 and B2 which are adjacent to each other in the first direction, together with the insulating material therebetween may form a capacitor, which is hereinafter referred to as a first capacitor CP1. Meanwhile, since different voltages are applied to the first bonding structures A1 and B1 and the second bonding structures A2 and B2 in a diagonal direction intersecting the first and second directions, each pair of the first bonding structures A1 and B1 and the second bonding structures A2 and B2 adjacent to each other in the diagonal direction, and the insulating material therebetween may form a capacitor, which is hereinafter referred to as a second capacitor CP2. Since a distance between each pair of the first bonding structures A1 and B1 and the second bonding structures A2 and B2 in the first direction is smaller than a distance between the first bonding structures A1 and B1 and the second bonding structures A2 and B2 in the diagonal direction, a capacitance of the first capacitor CP1 may be greater than a capacitance of the second capacitor CP2.

Meanwhile, in the embodiments of FIGS. 1 and 2, the first bonding structures A1 and B1 and the second bonding structures A2 and B2 are alternately arranged along the first direction, and thus, the lower conductive line L1 and the upper conductive line L2 extend in the first direction. However, the arrangement direction of the first bonding structures A1 and B1 and the second bonding structures A2 and B2 may be varied, and accordingly, extension directions of the lower conductive line L1 and the upper conductive line L2 may also be varied.

For example, while the first bonding structures A1 and B1 and the second bonding structures A2 and B2 are alternately arranged along the second direction, the first bonding structures A1 and B1 may be arranged in a line along the first direction, and the second bonding structures A2 and B2 may be arranged in a line along the first direction. In this case, the lower conductive line L1 and the upper conductive line L2 may extend along the second direction.

Alternatively, for example, while the first bonding structures A1 and B1 and the second bonding structures A2 and B2 are alternately arranged along the first direction, the first bonding structures A1 and B1 and the second bonding structures A2 and B2 may be alternately arranged along the second direction. In this case, each of the lower conductive line L1 and the upper conductive line L2 may extend along one of the first and second directions. This will be described with reference to FIG. 3 below.

Alternatively, for example, while the first bonding structures A1 and B1 and the second bonding structures A2 and B2 are alternately arranged along the first direction, the first bonding structures A1 and B1 may be arranged in a zigzag type along the second direction, and the second bonding structures A2 and B2 may be arranged in a zigzag type along the second direction. In this case, the lower conductive line L1 and the upper conductive line L2 may extend along the first direction. This will be described with reference to FIG. 4 below.

Figure 3:
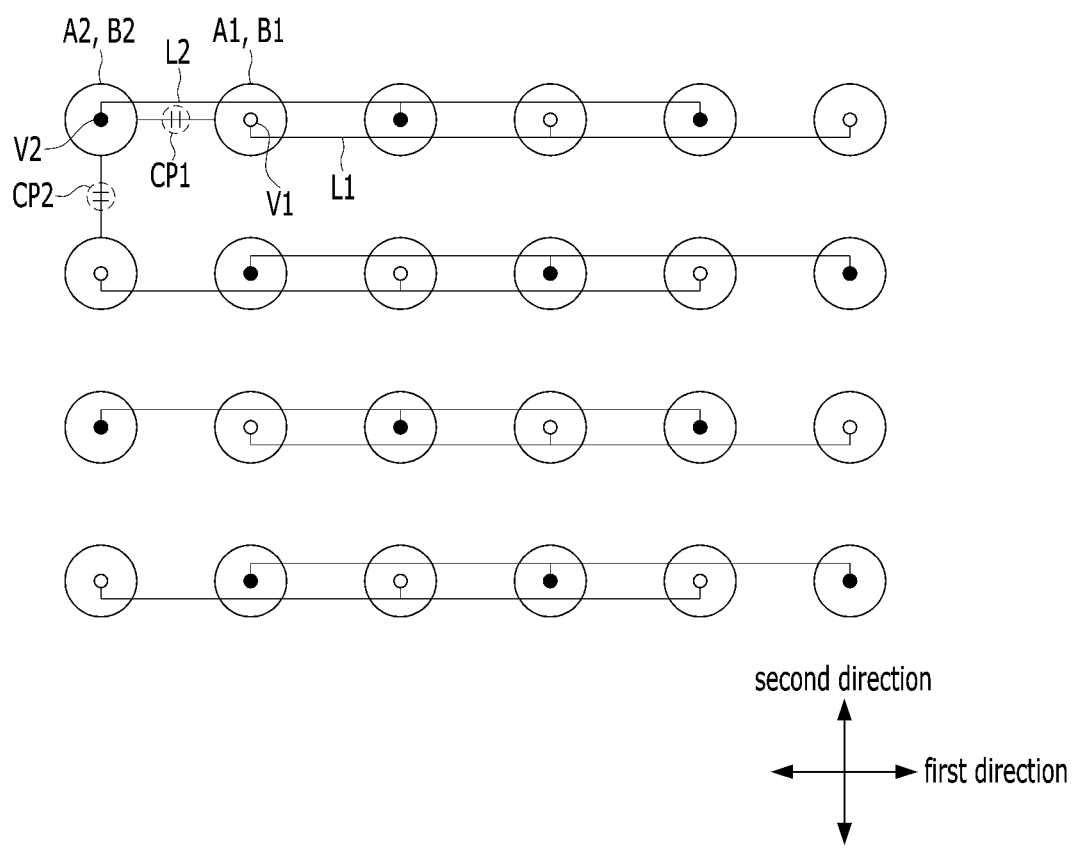
FIG. 3 is a plan view of a semiconductor device according to another embodiment of the present disclosure.

FIG. 3 is a plan view of a semiconductor device according to another embodiment of the present disclosure, in particular, a top view of a region corresponding to the second region of FIG. 1.

Referring to FIG. 3, in a first direction, first bonding structures A1 and B1 and second bonding structures A2 and B2 may be alternately arranged. Also, in a second direction, the first bonding structures A1 and B1 and the second bonding structures A2 and B2 may be alternately arranged.

The first bonding structures A1 and B1 may be respectively connected to lower conductive vias V1, and the lower conductive vias V1 may be connected to a lower conductive line L1 extending in the first direction.

The second bonding structures A2 and B2 may be respectively connected to upper conductive vias V2, and the upper conductive vias V2 may be connected to an upper conductive line L2 extending in the first direction.

Since different voltages are applied to the first bonding structure A1 and B1 and the second bonding structure A2 and B2, each pair of the first bonding structures A1 and B1 and the second bonding structures A2 and B2 which are adjacent to each other in the first direction, and the insulating material disposed between them may form a first capacitor CP1. Each pair of the first bonding structures A1 and B1 and the second bonding structures A2 and B2 which are adjacent to each other in the second direction, and the insulating material disposed between them may form a second capacitor CP2. Since a distance between the first bonding structure A1 and B1 and the second bonding structure A2 and B2 in the first direction is substantially the same as a distance between the first bonding structure A1 and B1 and the second bonding structure A2 and B2 in second direction, a capacitance of the first capacitor CP1 may be substantially equal to a capacitance of the second capacitor CP2. With this modification, it may be possible to secure a capacitor having a larger capacitance compared to the embodiment of FIG. 2.

In the present embodiment, the direction of at least one of the lower conductive line L1 and the upper conductive line L2 may be varied. For example, while the upper conductive line L2 is maintained, the lower conductive line L1 may extend in the second direction to connect the lower conductive vias V1 that are respectively connected to the first bonding structures A1 and B1 arranged in the second direction. Alternatively, for example, while the lower conductive line L1 is maintained, the upper conductive line L2 may extend in the second direction to connect the upper conductive vias V2 that are respectively connected to the second bonding structures A2 and B2 arranged in the second direction. Alternatively, for example, the lower conductive line L1 may extend in the second direction to connect the lower conductive vias V1 that are respectively connected to the first bonding structures A1 and B1 arranged in the second direction, and the upper conductive line L2 may extend in the second direction to connect the upper conductive vias V2 that are respectively connected to the second bonding structures A2 and B2 arranged in the second direction.

Figure 4:
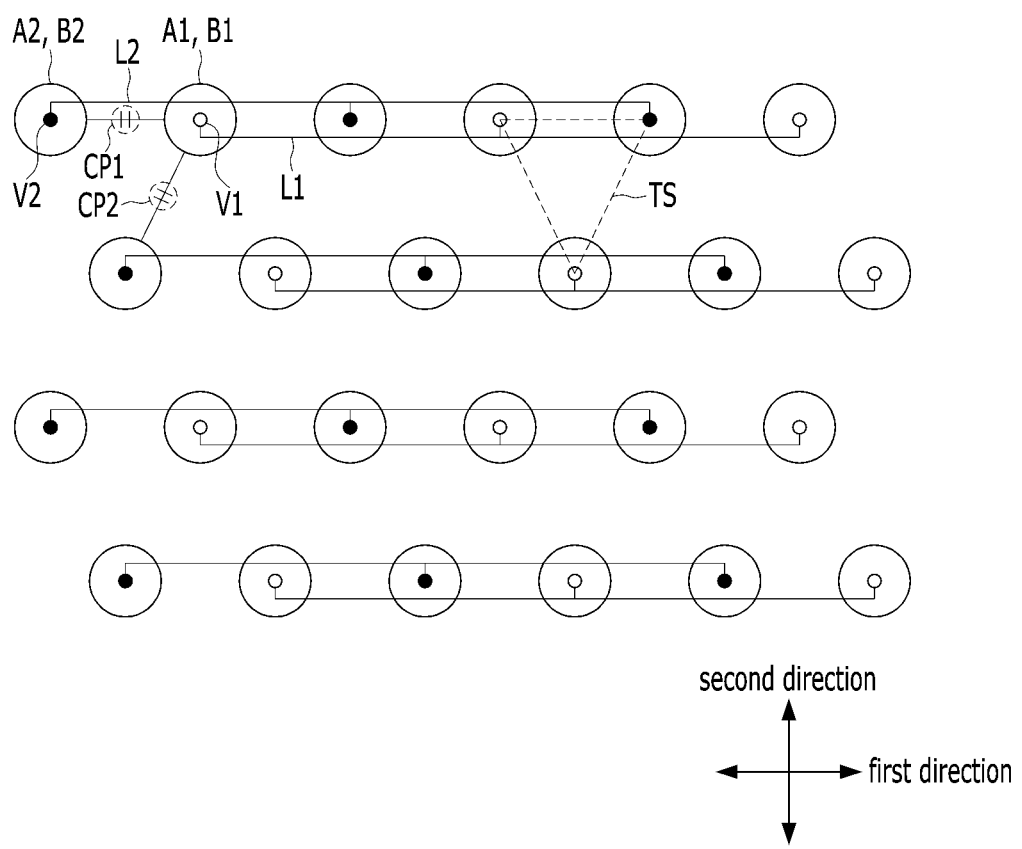
FIG. 4 is a plan view of a semiconductor device according to another embodiment of the present disclosure.

FIG. 4 is a plan view of a semiconductor device according to another embodiment of the present disclosure, in particular, a top view of a region corresponding to the second region of FIG. 1.

Referring to FIG. 4, in a first direction, first bonding structures A1 and B1 and second bonding structures A2 and B2 may be alternately arranged. Also, in a second direction, the first bonding structures A1 and B1 may be arranged in a zigzag type. That is, the first bonding structures A1 and B1 may not be positioned on a straight line extending in the second direction, but may be alternately arranged at one side and the other side of a straight line extending in the second direction. Similarly, in the second direction, the second bonding structures A2 and B2 may be arranged in a zigzag type. In this case, the first bonding structures A1 and B1 and the second bonding structure A2 and B2 adjacent to each other in the first direction, and the first bonding structure A1 and B1 or the second bonding structure A2 and B2 adjacent to them in a diagonal direction crossing the first and second directions, may be respectively positioned at three vertexes of a virtual triangle (see a dotted line TS). This triangle may be an equilateral triangle.

The first bonding structures A1 and B1 may be respectively connected to lower conductive vias V1, and the lower conductive vias V1 may be connected to a lower conductive line L1 extending in the first direction.

The second bonding structures A2 and B2 may be respectively connected to upper conductive vias V2, and the upper conductive vias V2 may be connected to an upper conductive line L2 extending in the first direction.

Since different voltages are applied to the first bonding structure A1 and B1 and the second bonding structure A2 and B2, the first bonding structure A1 and B1 and the second bonding structure A2 and B2 adjacent to each other in the first direction, and an insulating material between them may form a first capacitor CP1. Also, one of the first bonding structure A1 and B1 and the second bonding structure A2 and B2 adjacent to each other in the first direction, the first bonding structures A1 and B1 or the second bonding structures A2 and B2 adjacent thereto in the diagonal direction, and an insulating material between them may form a second capacitor CP2. When the above-described virtual triangle TS is an equilateral triangle, a distance between the first bonding structure A1 and B1 and the second bonding structure A2 and B2 in the first direction may be substantially the same as a distance between the first bonding structure A1 and B1 and the second bonding structure A2 and B2 in the diagonal direction. Thus, a capacitance of the first capacitor CP1 may be substantially the same as a capacitance of the second capacitor CP2. With this modification, it may be possible to secure a capacitor having a larger capacitance than the embodiment of FIG. 2.

Meanwhile, in the above embodiments, the case where an electrode bonding pad has a substantially circular shape in a plan view has been described. However, the present disclosure is not limited thereto, and the planar shape of the electrode bonding pad may be variously modified such as an elliptical shape or a rectangular shape. As an example, the electrode bonding pad may have a square shape or a shape similar thereto in a plan view, which will be described with reference to FIG. 5.

Figure 5:
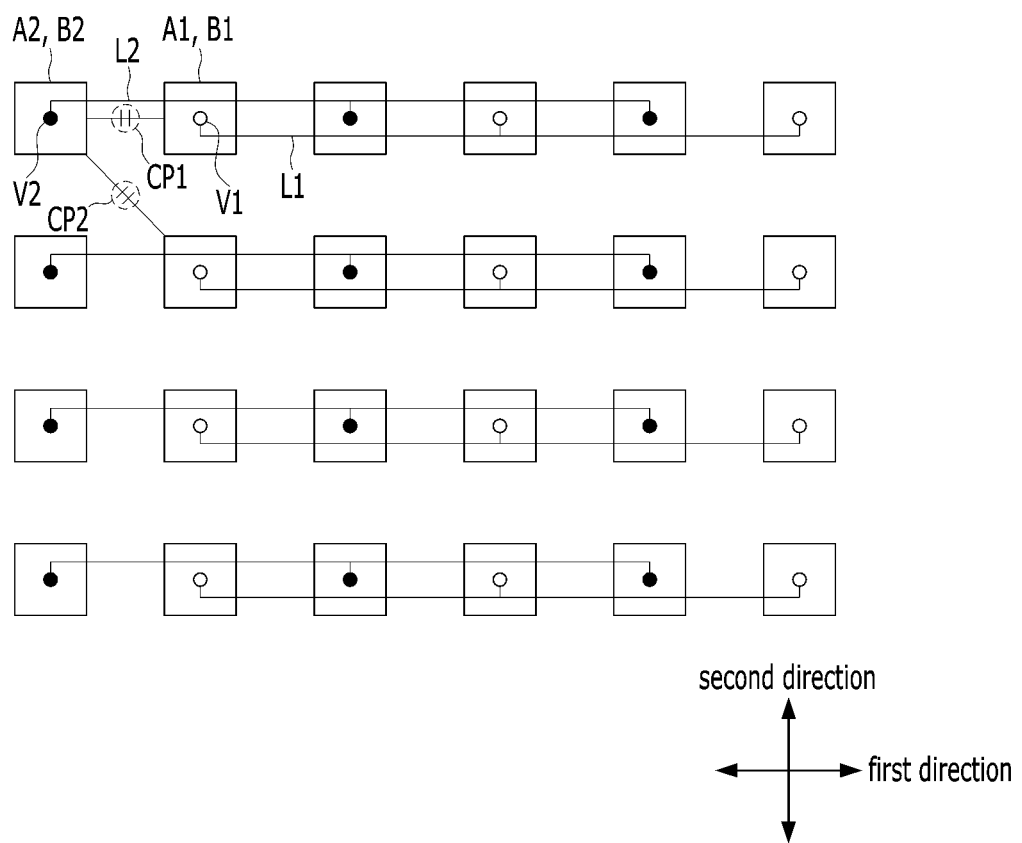
FIG. 5 is a plan view of a semiconductor device according to another embodiment of the present disclosure.

FIG. 5 is a plan view of a semiconductor device according to another embodiment of the present disclosure, in particular, a top view of a region corresponding to the second region of FIG. 1.

Referring to FIG. 5, a first lower electrode bonding pad A1, a second lower electrode bonding pad A2, a first upper electrode bonding pad B1, and a second upper electrode bonding pad B2 may have a square shape.

When the first lower electrode bonding pad A1, the second lower electrode bonding pad A2, the first upper electrode bonding pad B1, and the second upper electrode bonding pad B2 have a square shape, a capacitor may occupy a larger area compared to the embodiment of FIG. 2. Furthermore, a distance between the first bonding structure A1 and B1 and the second bonding structure A2 and B2 adjacent to each other in a diagonal direction intersecting first and second directions may be smaller than that of the embodiment of FIG. 2. Therefore, a capacitance of a second capacitor CP2 formed by the first bonding structure A1 and B1 and the second bonding structure A2 and B2 adjacent to each other in the diagonal direction, and an insulating material between them may be greater than that of the embodiment of FIG. 2.

Except for the points described above, the present embodiment may be substantially the same as the embodiment of FIG. 2, and thus, a detailed description thereof will be omitted.

Meanwhile, in the embodiment of FIG. 3 or FIG. 4, the first lower electrode bonding pad A1, the second lower electrode bonding pad A2, the first upper electrode bonding pad B1, and the second upper electrode bonding pad B2 may have a square shape instead of a circular shape.

In addition, although a planar shape of a real bonding pad has not been described in the above-described embodiments, it may have the same shape as or a different shape from that of an electrode bonding pad. That is, the real bonding pad may have a circular shape, a rectangular shape, or the like, independently of the shape of the electrode bonding pad. Since the real bonding pad is unrelated to the formation of the capacitor, it may have a shape advantageous to bonding, and thus, may have a planar shape different from that of the electrode bonding pad. For example, the real bonding pad may have a circular shape, and the electrode bonding pad may have a square shape.

Figure 6:
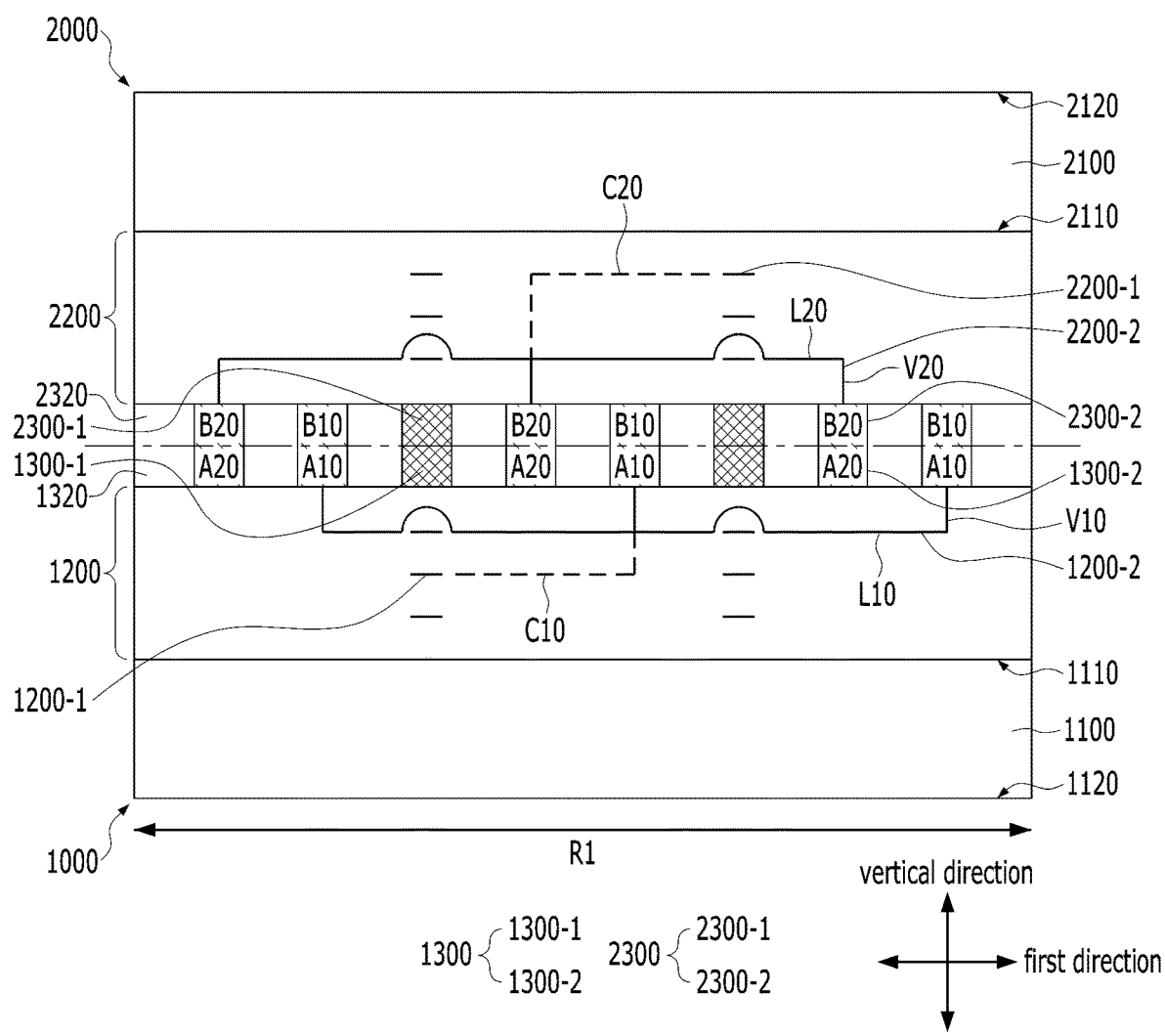
FIG. 6 is a cross-sectional view illustrating a semiconductor device according to another embodiment of the present disclosure.

FIG. 6 is a cross-sectional view illustrating a semiconductor device according to another embodiment of the present disclosure. Differences from FIG. 1 will be mainly described.

Referring to FIG. 6, a semiconductor device according to an embodiment of the present disclosure may include a lower semiconductor structure 1000 and an upper semiconductor structure 2000 disposed over the lower semiconductor structure 1000 and electrically connected to the lower semiconductor structure 1000.

The lower semiconductor structure 1000 may include a lower semiconductor substrate 1100, a lower circuit unit 1200, a lower bonding pad 1300 including a plurality of lower real bonding pads 1300-1 and a plurality of lower electrode bonding pads 1300-2, and a lower bonding insulating layer 1320. In an embodiment, the lower real bonding pads 1300-1 and the lower electrode bonding pads 1300-2 may be disposed in the lower bonding insulating layer 1320 at regular intervals.

The lower semiconductor substrate 1100 may have a front surface 1110, a rear surface 1120, and a side surface connecting them to each other. In addition, the lower semiconductor substrate 1100 may include a first region R1 in which an integrated circuit and the lower real bonding pad 1300-1 are disposed. The first region R1 may be a chip region.

The lower circuit unit 2200 may be disposed over the front surface 1110 of the lower semiconductor substrate 1100, and the lower bonding pad 1300 and the lower bonding insulating layer 1320 may be disposed over the lower circuit unit 1200.

The lower circuit unit 1200 may include an integrated circuit implemented to perform a predetermined function by combining and electrically connecting various discrete elements, and an insulating layer in which the integrated circuit is buried. A conductive pattern of the integrated circuit, which is connected to a first voltage, will be referred to as a first voltage application pattern 1200-1.

The lower real bonding pad 1300-1 and the lower electrode bonding pad 1300-2 may be positioned over the lower circuit unit 1200, and may be present in the first region R1. That is, not only the lower real bonding pad 1300-1 connected to the integrated circuit, but also the lower electrode bonding pad 1300-2 may coexist in the first region R1 corresponding to the chip region. The lower electrode bonding pad 1300-2 to which the first voltage is applied is denoted by A10 and referred to as a first lower electrode bonding pad. In addition, the lower electrode bonding pad 1300-2 to which a second voltage different from the first voltage is applied is denoted by A20 and referred to as a second lower electrode bonding pad.

The lower electrode bonding pad 1300-2 may be located in a region where the lower real bonding pad 1300-1 is not located, that is, between the lower real bonding pads 1300-1. However, the first lower electrode bonding pad A10 and the second lower electrode bonding pad A20 adjacent to each other may form a pair. That is, the pair of the first lower electrode bonding pad A10 and the second lower electrode bonding pad A20 may be positioned between the lower real bonding pads 1300-1. In this cross-sectional view, three pairs of the first lower electrode bonding pads A10 and the second lower electrode bonding pads A20 are arranged along the first direction, and the lower real bonding pad 1300-1 is disposed between adjacent pairs of the first lower electrode bonding pads A10 and second lower electrode bonding pads A20, but the present disclosure is not limited thereto. The number of the pairs of the first and second lower electrode bonding pads A10 and A20, the number of the lower real bonding pads 1300-1, and their arrangement may be variously modified.

The lower circuit unit 1200 may include a lower connection pattern 1200-2 connected to the first lower electrode bonding pad A10. The lower connection pattern 1200-2 may be electrically blocked from the second lower electrode bonding pad A20 and the lower real bonding pad 1300-1. In addition, the lower connection pattern 1200-2 may be electrically blocked from the integrated circuit, except for the first voltage application pattern 1200-1 of the lower circuit unit 1200. When a plurality of first lower electrode bonding pads A10 are disposed, the lower connection pattern 1200-2 may connect them to each other. The lower connection pattern 1200-2 may be formed by a combination of a lower conductive vias V10 and a lower conductive line L10.

The lower connection pattern 1200-2 may be electrically connected to the first voltage application pattern 1200-1 through a conductive pattern C10 indicated by a dotted line.

The lower bonding insulating layer 1320 may be formed to fill a space between the lower bonding pads 1300 over the lower circuit unit 1200.

The upper semiconductor structure 2000 may include an upper semiconductor substrate 2100, an upper circuit unit 2200, an upper bonding pad 2300 including a plurality of upper real bonding pads 2300-1 and a plurality of upper electrode bonding pads 2300-2, and an upper bonding insulating layer 2320. In an embodiment, the plurality of upper real bonding pads 2300-1 and the plurality of upper electrode bonding pads 2300-2 may be disposed in the upper bonding insulating layer 2320 at regular intervals.

The upper semiconductor substrate 2100 may have a front surface 2110, a rear surface 2120, and a side surface connecting them to each other. In addition, the upper semiconductor substrate 2100 may include a first region R1 in which an integrated circuit and the upper real bonding pad 2300-1 are disposed.

The upper circuit unit 2200 may be disposed under the front surface 2110 of the upper semiconductor substrate 2100, and the upper bonding pad 2300 and the upper bonding insulating layer 2320 may be disposed below the upper circuit unit 2200.

The upper circuit unit 1200 may include an integrated circuit implemented to perform a predetermined function by combining and electrically connecting various discrete elements, and an insulating layer in which the integrated circuit is buried. A conductive pattern of the integrated circuit, which is connected to the second voltage, will be referred to as a second voltage application pattern 2200-1.

The upper real bonding pad 2300-1 and the upper electrode bonding pad 2300-2 may be located under the upper circuit unit 2200, and may be present in the first region R1. That is, not only the upper real bonding pad 2300-1 connected to the integrated circuit, but also the upper electrode bonding pad 2300-2 may exist together in the first region R1 corresponding to the chip region. The upper electrode bonding pad 2300-2 to which the first voltage is applied is denoted by B10 and referred to as a first upper electrode bonding pad. Also, the upper electrode bonding pad 2300-2 to which the second voltage different from the first voltage is applied is denoted by B20 and referred to as a second upper electrode bonding pad.

The upper real bonding pads 2300-1 may be arranged to contact the lower real bonding pads 1300-1, respectively. The upper electrode bonding pads 2300-2 may be arranged to contact the lower electrode bonding pads 1300-2, respectively. Furthermore, the first upper electrode bonding pads B10 may be arranged to contact the first lower electrode bonding pads A10, respectively, and the second upper electrode bonding pads B20 may be arranged to contact the second lower electrode bonding pads A20, respectively.

The upper circuit unit 2200 may include an upper connection pattern 2200-2 connected to the second upper electrode bonding pad B20. The upper connection pattern 2200-2 may be electrically blocked from the first upper electrode bonding pad B10 and the upper real bonding pad 2300-1. In addition, the upper connection pattern 2200-2 may be electrically blocked from the integrated circuit, except for the second voltage application pattern 2200-1 in the upper circuit unit 2200. When a plurality of second upper electrode bonding pads B20 are disposed, the upper connection pattern 2200-2 may connect them to each other. The upper connection pattern 2200-2 may be formed by a combination of an upper conductive vias V20 and an upper conductive line L20.

The upper connection pattern 2200-2 may be electrically connected to the second voltage application pattern 2200-1 through a conductive pattern C20 indicated by a dotted line.

The upper bonding insulating layer 2320 may be formed to fill a space between the upper bonding pads 2300 under the upper circuit unit 2200.

The lower semiconductor structure 1000 and the upper semiconductor structure 2000 described above may be connected to each other by hybrid bonding.

According to the semiconductor device described above, since an electrode bonding pad is formed together in a region where a real bonding pad and an integrated circuit are formed, a distance to a first voltage application pattern and/or a second voltage application pattern may be short. Accordingly, since a resistance of an electrical path between the electrode bonding pad and the first voltage application pattern and/or the second voltage application pattern is reduced, high-speed operation of the semiconductor device may be advantageous.

Figure 7:
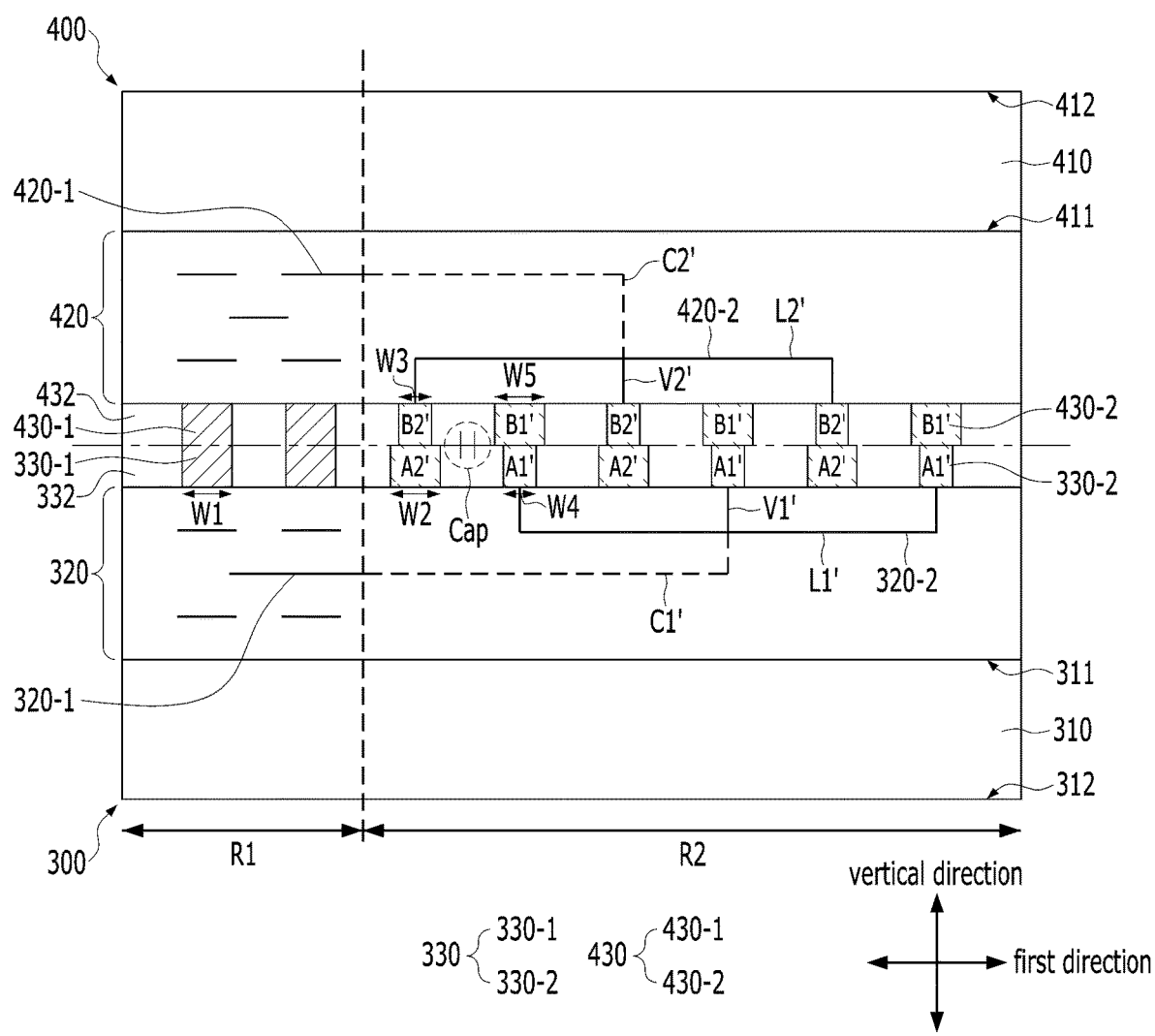
FIG. 7 is a cross-sectional view illustrating a semiconductor device according to another embodiment of the present disclosure.

FIG. 7 is a cross-sectional view illustrating a semiconductor device according to another embodiment of the present disclosure. Differences from FIG. 1 will be mainly described.

Referring to FIG. 7, a semiconductor device according to an embodiment of the present disclosure may include a lower semiconductor structure 300 and an upper semiconductor structure 400 disposed over the lower semiconductor structure 300 and electrically connected to the lower semiconductor structure 300.

The lower semiconductor structure 300 may include a lower semiconductor substrate 310, a lower circuit unit 320, a lower bonding pad 330 including a plurality of lower real bonding pads 330-1 and a plurality of lower electrode bonding pads 330-2, and a lower bonding insulating layer 332. In an embodiment, the plurality of lower real bonding pads 330-1 and the plurality of the lower electrode bonding pads 330-2 may be disposed in the lower bonding insulating layer 332 at regular intervals.

The lower real bonding pad 330-1 may be present in a first region R1 over the lower circuit unit 320. The lower electrode bonding pad 330-2 may be present in a second region R2 over the lower circuit unit 320. However, the present disclosure is not limited thereto, and the lower real bonding pad 330-1 and the lower electrode bonding pad 330-2 may coexist in the same region, for example, a chip region.

The lower electrode bonding pad 330-2 to which a first voltage is applied is denoted by A1' and referred to as a first lower electrode bonding pad. In addition, the lower electrode bonding pad 330-2 to which a second voltage different from the first voltage is applied is denoted by A2' and referred to as a second lower electrode bonding pad. In the present embodiment, a plurality of first lower electrode bonding pads A1' may have a constant width W4, and a plurality of second lower electrode bonding pads A2' may have a constant width W2. The width W2 may be different from the width W4. For example, the width W4 of the first lower electrode bonding pad A1' may be smaller than the width W2 of the second lower electrode bonding pad A2'. Furthermore, the width W4 of the first lower electrode bonding pad A1' may be smaller than a width W1 of the lower real bonding pad 330-1. The width W2 of the second lower electrode bonding pad A2' may be substantially equal to the width W1 of the lower real bonding pad 330-1. However, the present disclosure is not limited thereto, and at least one of the plurality of first and second lower electrode bonding pads A1' and A2' may have a different width and/or planar area from another one.

The upper semiconductor structure 400 may include an upper semiconductor substrate 410, an upper circuit unit 420, an upper bonding pad 430 including an upper real bonding pad 430-1 and an upper electrode bonding pad 430-2, and an upper bonding insulating layer 432.

The upper real bonding pad 430-1 may be present in the first region R1 under the upper circuit unit 420. The upper electrode bonding pad 430-2 may be present in the second region R2 under the upper circuit unit 420. However, the present disclosure is not limited thereto, and the upper real bonding pad 430-1 and the upper electrode bonding pad 430-2 may coexist in the same region, for example, a chip region, similar to the embodiment of FIG. 6.

The upper electrode bonding pad 430-2 to which the first voltage is applied is denoted as B1' and referred to as a first upper electrode bonding pad. In addition, the upper electrode bonding pad 430-2 to which the second voltage different from the first voltage is applied is denoted as B2' and referred to as a second upper electrode bonding pad. In the present embodiment, a plurality of first upper electrode bonding pads B1' may have a constant width W5, and a plurality of second upper electrode bonding pads B2' may have a constant width W3. The width W3 and the width W5 may be different from each other. For example, the width W5 of the first upper electrode bonding pad B1' may be greater than the width W3 of the second upper electrode bonding pad B2'. Furthermore, the width W3 of the second upper electrode bonding pad B2' may be smaller than a width W1 of the upper real bonding pad 430-1. The width W5 of the first upper electrode bonding pad B1' may be substantially equal to the width W1 of the upper real bonding pad 430-1. However, the present disclosure is not limited thereto, and at least one of the plurality of first and second upper electrode bonding pads B1' and B2' may have a different width and/or planar area from another one.

Furthermore, one of the plurality of first and second upper electrode bonding pads B1' and B2' may have a width different from a width of one of the plurality of first and second lower electrode bonding pads A1' and A2', which corresponds to the one of the plurality of first and second upper electrode bonding pads B1' and B2'. For example, as shown, the width W4 of the first lower electrode bonding pad A1' may be smaller than the width W5 of the first upper electrode bonding pad B1', and the width W2 of the second lower electrode bonding pad A2' may be greater than the width W3 of the second upper electrode bonding pad B2'. However, the present disclosure is not limited thereto, and it may be sufficient as long as the width of one of a lower electrode bonding pad and an upper electrode bonding pad corresponding to each other is smaller than that of the other one.

According to the semiconductor device described above, at least one of a lower electrode bonding pad and an upper electrode bonding pad may have a smaller width than that of the above-described embodiments. This width may be smaller than a width of a real bonding pad of the above-described embodiment or the present embodiment. In this case, compared to the above-described embodiments, a density of a metal forming the lower and upper electrode bonding pads, for example, a density of copper, may decrease in a region where the lower and upper electrode bonding pads are disposed, and thus, a bonding success rate may increase. Furthermore, when the width of the lower electrode bonding pad is reduced, the width of the corresponding upper electrode bonding pad may increase, and when the width of the upper electrode bonding pad is reduced, the width of the corresponding lower electrode bonding pad may increase. Therefore, while reducing the density of copper in each of the lower semiconductor structure and the upper semiconductor structure, the lower semiconductor structure and the upper semiconductor structure may have the same or similar copper density.

Although various embodiments have been described for Illustrative purposes, it will be apparent to those skilled in the art that various changes and modifications may be made without departing from the spirit and scope of the present teachings as defined in the following claims.

What is claimed is:

1. A semiconductor device comprising:
    a lower semiconductor structure including a plurality of first lower electrode bonding pads, a plurality of second lower electrode bonding pads, and a lower connection pattern connecting the plurality of first lower electrode bonding pads to each other, wherein the lower connection pattern is connected to a first voltage; and
    an upper semiconductor structure disposed over the lower semiconductor structure and including a plurality of first upper electrode bonding pads, a plurality of second upper electrode bonding pads, and an upper connection pattern connecting the plurality of second upper electrode bonding pads to each other, wherein the upper connection pattern is connected to a second voltage that is different from the first voltage,
    wherein the plurality of first lower electrode bonding pads are bonded to the plurality of first upper electrode bonding pads, respectively, to form a plurality of first bonding structures, and
    the plurality of second lower electrode bonding pads are bonded to the plurality of second upper electrode bonding pads, respectively, to form a plurality of second bonding structures.

2. The semiconductor device according to claim 1, further comprising:
    a lower bonding insulating layer filled between the plurality of first lower electrode bonding pads and the plurality of second lower electrode bonding pads; and
    an upper bonding insulating layer filled between the plurality of first upper electrode bonding pads and the plurality of second upper electrode bonding pads,
    wherein the upper bonding insulating layer is bonded to the lower bonding insulating layer.

3. The semiconductor device according to claim 1, wherein the first bonding structure, the second bonding structure, and an insulating material between the first and second bonding structures form a capacitor,
    wherein the first and second bonding structures are disposed adjacent to each other.

4. The semiconductor device according to claim 1, wherein the lower connection pattern is electrically blocked from the plurality of second lower electrode bonding pads, and
    the upper connection pattern is electrically blocked from the plurality of first upper electrode bonding pads.

5. The semiconductor device according to claim 1, wherein the plurality of first bonding structures and the plurality of second bonding structures are alternately arranged along a first direction.

6. The semiconductor device according to claim 5, wherein the lower connection pattern includes a lower conductive line extending in the first direction while electrically connecting the plurality of first lower electrode bonding pads to each other under the plurality of first lower electrode bonding pads, and
    the upper connection pattern includes an upper conductive line extending in the first direction while electrically connecting the plurality of second upper electrode bonding pads to each other over the plurality of second upper electrode bonding pads.

7. The semiconductor device according to claim 5, wherein the plurality of first bonding structures are arranged in a line along a second direction crossing the first direction, and
    the plurality of second bonding structures are arranged in a line along the second direction.

8. The semiconductor device according to claim 5, wherein the plurality of first bonding structures and the plurality of second bonding structures are alternately arranged along a second direction crossing the first direction.

9. The semiconductor device according to claim 8, wherein the lower connection pattern includes a lower conductive line extending in one of the first direction and the second direction while electrically connecting the plurality of first lower electrode bonding pads to each other under the plurality of first lower electrode bonding pads, and
    the upper connection pattern includes an upper conductive line extending in one of the first direction and the second direction while electrically connecting the plurality of second upper electrode bonding pads to each other over the plurality of second upper electrode bonding pads.

10. The semiconductor device according to claim 5, wherein the plurality of first bonding structures are arranged in a zigzag type along a second direction crossing the first direction, and
    the plurality of second bonding structures are arranged in a zigzag type along the second direction.

11. The semiconductor device according to claim 10, wherein the first bonding structure and the second bonding structure adjacent to each other in the first direction, and the first bonding structure or the second bonding structure adjacent to them in the second direction are located at vertices of a virtual equilateral triangle, respectively.

12. The semiconductor device according to claim 1, wherein each of the first lower electrode bonding pad, the second lower electrode bonding pad, the first upper electrode bonding pad, and the second upper electrode bonding pad has a square shape.

13. The semiconductor device according to claim 1, wherein each of the first lower electrode bonding pad, the second lower electrode bonding pad, the first upper electrode bonding pad, and the second upper electrode bonding pad has a circular shape.

14. The semiconductor device according to claim 1, wherein the lower semiconductor structure and the upper semiconductor structure have chip regions overlapping each other and dummy regions overlapping each other,
the lower semiconductor structure further includes a lower real bonding pad disposed in the chip region thereof,
the upper semiconductor structure further includes an upper real bonding pad disposed in the chip region thereof and bonded to the lower real bonding pad, and
the first and second bonding structures are disposed in the dummy regions.

15. The semiconductor device according to claim 14, wherein the lower semiconductor structure further includes an integrated circuit disposed in the chip region thereof and including a first voltage application pattern for applying the first voltage, and
the upper semiconductor structure further includes an integrated circuit disposed in the chip region thereof and including a second voltage application pattern for applying the second voltage.

16. The semiconductor device according to claim 15, wherein the lower connection pattern is electrically connected to the first voltage application pattern, and
the upper connection pattern is electrically connected to the second voltage application pattern.

17. The semiconductor device according to claim 1, wherein the lower semiconductor structure and the upper semiconductor structure have chip regions overlapping each other,
the lower semiconductor structure further includes a lower real bonding pad disposed in the chip region thereof,
the upper semiconductor structure further includes an upper real bonding pad disposed in the chip region thereof and bonded to the lower real bonding pad, and
the first and second bonding structures are disposed in the chip regions.

18. The semiconductor device according to claim 17, wherein a structure formed by bonding the lower real bonding pad and the upper real bonding pad is disposed between a first pair of the first and second bonding structures adjacent to each other and a second pair of the first and second bonding structures adjacent to each other.

19. The semiconductor device according to claim 17, wherein the lower semiconductor structure further includes an integrated circuit disposed in the chip region thereof and including a first voltage application pattern for applying the first voltage, and
the upper semiconductor structure further includes an integrated circuit disposed in the chip region thereof and including a second voltage application pattern for applying the second voltage.

20. The semiconductor device according to claim 19, wherein the lower connection pattern is electrically connected to the first voltage application pattern, and
the upper connection pattern is electrically connected to the second voltage application pattern.

21. The semiconductor device according to claim 1, wherein a width of one of the plurality of first and second lower electrode bonding pads is different from a width of another one of the plurality of first and second lower electrode bonding pads, and
a width of one of the plurality of first and second upper electrode bonding pads is different from a width of another one of the plurality of first and second upper electrode bonding pads.

22. The semiconductor device according to claim 1, wherein a width of one of the plurality of first and second lower electrode bonding pads is different from a width of one of the plurality of first and second upper electrode bonding pads, which corresponds to the one of the plurality of first and second lower electrode bonding pads.

* * * * *